(12) United States Patent
Baur et al.

(10) Patent No.: US 9,660,365 B2
(45) Date of Patent: May 23, 2017

(54) PRINTED CIRCUIT BOARD

(71) Applicant: CONTINENTAL AUTOMOTIVE GMBH, Hannover (DE)

(72) Inventors: Frank Baur, Nuremberg (DE); Detlev Bagung, Bernhardswald (DE)

(73) Assignee: Continental Automotive GmbH, Hannover (DE)

( * ) Notice: Subject to any disclaimer, the term of this patent is extended or adjusted under 35 U.S.C. 154(b) by 0 days.

(21) Appl. No.: 14/858,112

(22) Filed: Sep. 18, 2015

(65) Prior Publication Data
US 2016/0087357 A1    Mar. 24, 2016

(30) Foreign Application Priority Data

Sep. 18, 2014  (DE) ................. 10 2014 218 821

(51) Int. Cl.
| H01R 12/00 | (2006.01) |
| H01R 12/70 | (2011.01) |
| H05K 1/02 | (2006.01) |
| H05K 3/46 | (2006.01) |

(52) U.S. Cl.
CPC ..... *H01R 12/7047* (2013.01); *H01R 12/7041* (2013.01); *H05K 1/028* (2013.01); *H05K 3/4691* (2013.01)

(58) Field of Classification Search
CPC ......... H01R 12/52; H01R 12/73; H01R 13/24
USPC .................................................. 439/65, 67
See application file for complete search history.

(56) References Cited

U.S. PATENT DOCUMENTS

| 6,927,344 | B1 * | 8/2005 | Gall | H05K 1/0278 174/254 |
| 8,029,165 | B2 * | 10/2011 | Livesay | H01L 25/075 362/247 |
| 8,148,642 | B2 * | 4/2012 | Bagung | H05K 1/0278 174/254 |
| 8,294,031 | B2 * | 10/2012 | Bagung | H05K 1/0278 174/254 |
| 8,342,717 | B1 | 1/2013 | Livesay et al. | |
| 8,624,130 | B2 * | 1/2014 | Bagung | H05K 1/0278 174/261 |
| 8,975,527 | B2 * | 3/2015 | Takaoka | H05K 1/028 174/254 |

FOREIGN PATENT DOCUMENTS

| DE | 4212369 A1 | 10/1993 |
| DE | 1020122210002 A1 | 5/2014 |
| DE | 102013200635 A1 | 7/2014 |
| WO | 2014111313 A1 | 7/2014 |

* cited by examiner

*Primary Examiner* — Xuong Chung Trans
(74) *Attorney, Agent, or Firm* — Laurence A. Greenberg; Werner H. Stemer; Ralph E. Locher

(57) ABSTRACT

A printed circuit board includes at least two rigid printed circuit board parts which are connected to one another by at least one flexible connecting part which is thinner than the rigid printed circuit board parts. The at least two rigid printed circuit board parts can be moved toward one another by bending the flexible connecting part. A groove, which is produced by the different thickness of the rigid printed circuit board parts relative to the flexible connecting part, is filled with an elastic material.

7 Claims, 1 Drawing Sheet

PRINTED CIRCUIT BOARD

CROSS-REFERENCE TO RELATED APPLICATION

This application claims the priority, under 35 U.S.C. §119, of German Patent Application DE 10 2014 218 821.0, filed Sep. 18, 2014; the prior application is herewith incorporated by reference in its entirety.

BACKGROUND OF THE INVENTION

Field of the Invention

The invention relates to a printed circuit board having at least two rigid printed circuit board parts which are connected to one another by at least one flexible connecting part which is thinner than the rigid printed circuit board parts, so that the rigid printed circuit board parts can be moved toward one another by bending the flexible connecting part.

A printed circuit board of that kind is known from German Patent Application DE 10 2013 200 635 A1, corresponding to International Publication WO 2014/111313 A1. In that document, a plurality of rigid printed circuit board parts are connected to one another by a corresponding number of flexible connecting parts and can be moved to a position which is oriented approximately perpendicular to the respectively adjacent printed circuit board part by bending the respective connecting part, in order to be able to be disposed in a housing in a space-saving manner in that way.

Individual or all printed circuit board parts are often populated with power components which, due to their high level of development of heat, have to be cooled and for that reason have to be moved into close contact with the often metal housing walls or other heat sinks. To that end, German Patent Application DE 10 2013 200 635 A1, corresponding to International Publication WO 2014/111313 A1, proposes thermally connecting a respective printed circuit board part by adhesive bonding or by a force-locking or form-locking connection of the respective printed circuit board part to a cooling panel, in particular the housing wall.

German Patent DE 42 12 369 C2 also proposes firmly clamping printed circuit boards to housing walls with the aid of metal springs.

However, all of those connecting and fastening methods are complicated and expensive.

BRIEF SUMMARY OF THE INVENTION

It is accordingly an object of the invention to provide a printed circuit board, which overcomes the hereinafore-mentioned disadvantages of the heretofore-known devices of this general type and in which the connecting and fastening are less complicated and less expensive.

With the foregoing and other objects in view there is provided, in accordance with the invention, a printed circuit board having at least two rigid printed circuit board parts that are connected to one another by at least one flexible connecting part which is thinner than the rigid printed circuit board parts so that the rigid printed circuit board parts can be moved toward one another by bending the connecting part. A groove which is produced by the different thickness of the printed circuit board parts in relation to the connecting part is filled with an elastic material.

Other features which are considered as characteristic for the invention are set forth in the appended claims.

Although the invention is illustrated and described herein as embodied in a printed circuit board, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
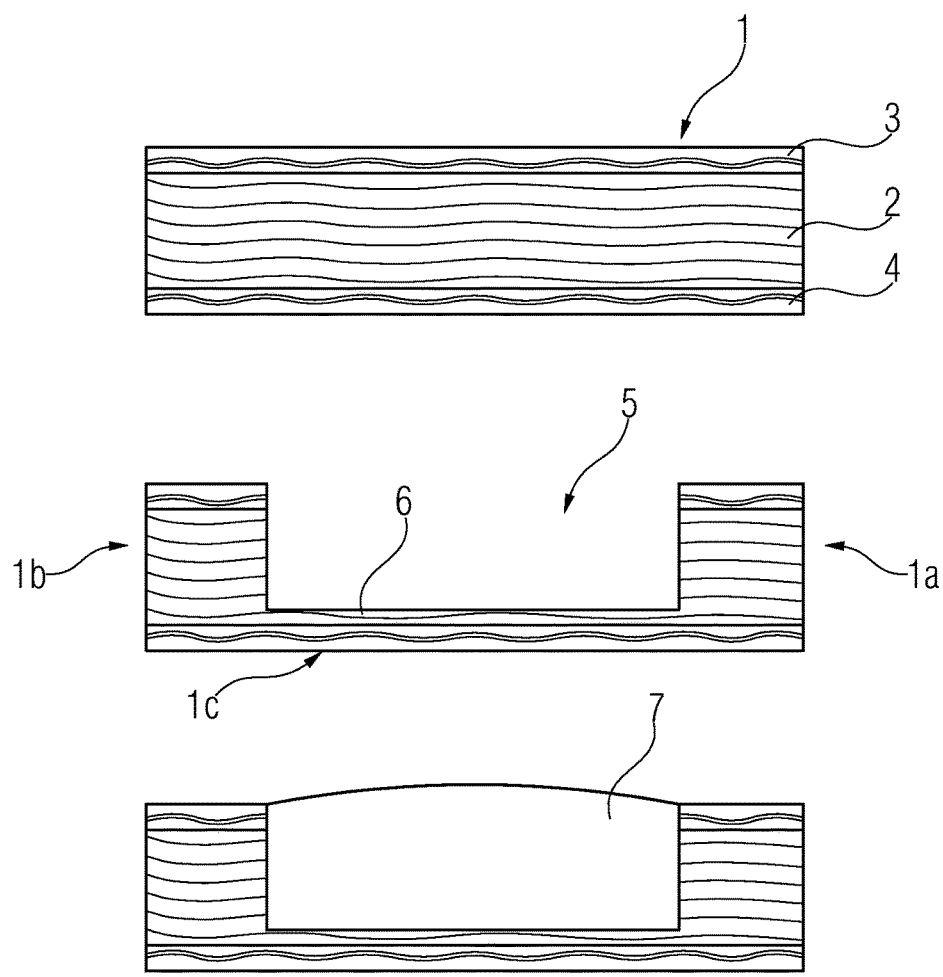
FIG. 1 is a group of three diagrammatic sectional views showing production method steps for producing a printed circuit board according to the invention.

Referring now to the figures of the drawings in detail and first, particularly, to FIG. 1 thereof, there is seen a portion of a printed circuit board 1 which is formed from an insulating substrate 2, for example a glass fiber-reinforced epoxy resin, and is provided with metal layers 3, 4 on its two surfaces. The metal layers 3, 4 are illustrated over the entire area in this case, but are structured in the regions of the printed circuit board 1 which are not illustrated, in order to produce conductor tracks on the surfaces of the printed circuit board 1. In principle, it would also be possible to provide further conductor tracks in the interior of the substrate 2, that is to say to use a multilayered printed circuit board.

In a first method step, as is illustrated in the central illustration in FIG. 1, a groove 5 is made in the printed circuit board 1, for example by milling. This produces two rigid printed circuit board parts 1a and 1b and a flexible connecting part 1c. The groove 5 can be made in the printed circuit board 1 to a greater or lesser depth, depending on how flexible the connecting part 1c is intended to be. In the illustrated example of FIG. 1, part of the substrate 2 also remains at the base of the groove 5 but, in principle, could also be milled-through down to the lower metal layer 4.

In a subsequent method step, an elastic material 7 is inserted into the groove 5 in accordance with the bottom illustration in FIG. 1.

Figure 2:
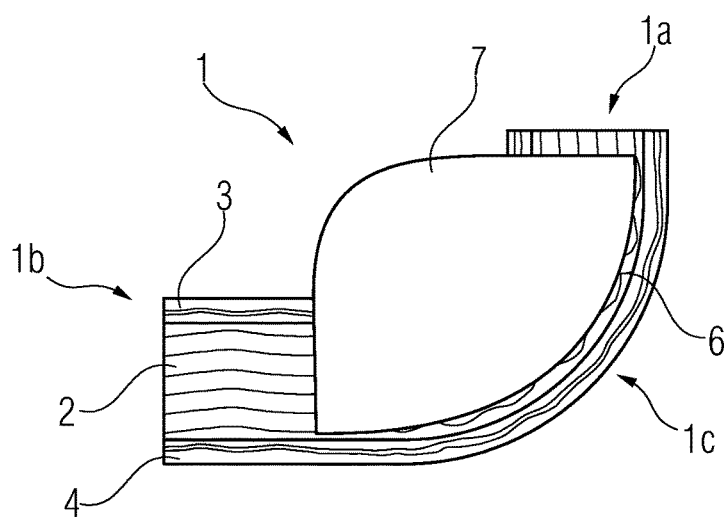
FIG. 2 is a sectional view showing a bent variant of a printed circuit board according to the invention.

By virtue of this measure according to the invention, the flexible material 7, which is, for example, an insulator and can be a silicone, is compressed and therefore exerts a restoring force onto the two printed circuit board parts 1a, 1b when the printed circuit board 1 is bent at the flexible connecting part 1c, as is illustrated in FIG. 2, so that the two printed circuit board parts 1a and 1b are oriented approximately orthogonally relative to one another. If the printed circuit board 1 which is bent in this way is then inserted into a housing and one of the two printed circuit board parts 1a or 1b is fastened to the housing, which is possible, for example, by screwing, adhesive bonding or the like, the other printed circuit board part is pressed against the corresponding housing wall by virtue of the restoring force of the elastic material 7, as a result of which further fastening can be dispensed with in this case.

The printed circuit board may include, for example, three rigid printed circuit board parts and two flexible connecting parts, with the two connecting parts thereof being bent through 90° in each case. A printed circuit board of this kind which is bent in a U-shape could be accommodated in a housing without further fastening features and, in the process, the printed circuit board parts could be pressed against the housing walls or the base and the cover due to the restoring forces of the elastic materials 7 in the grooves 5, in order to establish, for example, a good thermally conductive connection for cooling line components on the printed circuit board parts.

The invention claimed is:

1. A printed circuit board, comprising:
   at least two rigid printed circuit board parts;
   at least one flexible connecting part interconnecting said at least two rigid printed circuit board parts;
   said at least one flexible connecting part being thinner than said at least two rigid printed circuit board parts defining a groove produced by said different thicknesses of said at least two rigid printed circuit board parts and said at least one flexible connecting part;
   said at least one flexible connecting part being configured to bend to allow said at least two rigid printed circuit board parts to be moved toward one another;
   an elastic material filling said groove; and
   said at least one flexible connecting part having a bottom surface extending between said at least two rigid printed circuit board parts and contacting said elastic material, said bottom surface configured to form a concave shape as said at least two rigid printed circuit board parts are moved toward one another.

2. The printed circuit board according to claim 1, wherein said at least two rigid printed circuit board parts and said at least one flexible connecting part are integrally formed.

3. The printed circuit board according to claim 1, wherein said at least two rigid printed circuit board parts and said at least one flexible connecting part are formed in one piece.

4. The printed circuit board according to claim 2, wherein said groove is a deep-milled groove formed in an integral printed circuit board.

5. The printed circuit board according to claim 2, wherein said groove is a deep-milled groove formed in a one-piece printed circuit board.

6. The printed circuit board according to claim 1, wherein said elastic material is a silicone.

7. The printed circuit board according to claim 1, wherein said elastic material is an insulator.

* * * * *